(12) United States Patent
Ichikawa et al.

(10) Patent No.: US 11,735,509 B2
(45) Date of Patent: Aug. 22, 2023

(54) POWER SEMICONDUCTOR DEVICE AND MANUFACTURING METHOD THEREOF

(71) Applicant: Mitsubishi Electric Corporation, Tokyo (JP)

(72) Inventors: Keitaro Ichikawa, Tokyo (JP); Taketoshi Shikano, Tokyo (JP); Yuji Shikasho, Tokyo (JP); Fumihito Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/738,634

(22) Filed: Jan. 9, 2020

(65) Prior Publication Data
US 2020/0303295 A1      Sep. 24, 2020

(30) Foreign Application Priority Data
Mar. 22, 2019   (JP) .................................. 2019-054863

(51) Int. Cl.
*H01L 23/498* (2006.01)
*H01L 21/48* (2006.01)

(52) U.S. Cl.
CPC .... *H01L 23/49838* (2013.01); *H01L 21/4842* (2013.01); *H01L 23/49861* (2013.01)

(58) Field of Classification Search
CPC ... H01L 21/4821–4842; H01L 23/3107; H01L 23/495–49596; H01L 23/49838; H01L 23/49861
See application file for complete search history.

(56) References Cited

U.S. PATENT DOCUMENTS 4,920,074 A * 4/1990 Shimizu ............... H05K 3/3426
                                                              29/827
4,987,474 A * 1/1991 Yasuhara ............. H01L 23/4951
                                                              257/666
(Continued)

FOREIGN PATENT DOCUMENTS

CN          201323195 Y  * 10/2009
JP           61075553 A  *  4/1986   ....... H01L 23/49562
(Continued)

OTHER PUBLICATIONS

Mikami JP08008375, English translation, 6 pages. Retrieved from the internet on Apr. 12, 2021: https://dialog.proquest.com/professional/docview/1382636994?accountid=131444 (Year: 2021).*

(Continued)

*Primary Examiner* — Andres Munoz
(74) *Attorney, Agent, or Firm* — Studebaker & Brackett PC

(57) ABSTRACT

Provided are a power semiconductor device using a lead frame, in which deformation and bending of terminals is suppressed, insulation is secured between terminals, and mounting onto a control board is facilitated, and a manufacturing method thereof. A package in which a semiconductor element mounted on a lead frame is sealed, terminals being bent and exposed from side surfaces of the package, and, a terminal bending portion being a portion bent in each of the terminals, a width thereof being larger than a width of a tip of the terminal, and being equal to or smaller than the width of a contact portion of the terminal in contact with the package are provided; therefore, deformation and bending of the terminals is suppressed, a necessary insulation is secured between the adjacent terminals, and mounting onto a control board is facilitated.

3 Claims, 20 Drawing Sheets

(56) References Cited

U.S. PATENT DOCUMENTS

| | | | | |
|---|---|---|---|---|
| 5,294,829 | A * | 3/1994 | Hundt | G11C 5/141 |
| | | | | 257/666 |
| 5,736,784 | A * | 4/1998 | Dove | H05K 1/0243 |
| | | | | 257/692 |
| 5,883,424 | A * | 3/1999 | Tanaka | H01L 23/047 |
| | | | | 257/666 |
| 6,169,323 | B1 * | 1/2001 | Sakamoto | H01L 23/49541 |
| | | | | 257/667 |
| 6,444,905 | B1 * | 9/2002 | Miyaki | H01L 23/49541 |
| | | | | 174/555 |
| 7,821,111 | B2 * | 10/2010 | Tellkamp | H05K 3/3426 |
| | | | | 257/666 |
| 8,041,221 | B2 * | 10/2011 | Elberbaum | H01L 31/167 |
| | | | | 398/111 |
| 8,169,062 | B2 * | 5/2012 | Luo | H01L 24/85 |
| | | | | 257/666 |
| 8,435,867 | B2 * | 5/2013 | Fujishima | H01L 24/32 |
| | | | | 438/461 |
| 9,224,662 | B2 * | 12/2015 | Kadoguchi | H01L 23/49537 |
| 9,287,200 | B2 * | 3/2016 | Higgins, III | H01L 23/49541 |
| 10,249,558 | B2 * | 4/2019 | Shimakawa | H01L 23/50 |
| 10,930,523 | B2 * | 2/2021 | Ichikawa | H01L 23/49517 |
| 2003/0214026 | A1 * | 11/2003 | Tokuhara | H01L 23/13 |
| | | | | 257/692 |
| 2011/0110673 | A1 * | 5/2011 | Elberbaum | H01H 9/0271 |
| | | | | 398/202 |
| 2011/0198739 | A1 * | 8/2011 | Amanai | H01L 24/29 |
| | | | | 257/667 |
| 2011/0221005 | A1 * | 9/2011 | Luo | H01L 23/49575 |
| | | | | 257/368 |
| 2015/0001691 | A1 * | 1/2015 | Higgins, III | H01L 21/56 |
| | | | | 257/666 |
| 2015/0162274 | A1 * | 6/2015 | Kadoguchi | H01L 23/047 |
| | | | | 257/694 |
| 2016/0093561 | A1 | 3/2016 | Tabira et al. | |
| 2017/0309556 | A1 * | 10/2017 | Shimakawa | H01L 24/40 |
| 2018/0277469 | A1 | 9/2018 | Kamiyama | |
| 2019/0051539 | A1 * | 2/2019 | Ichikawa | H01L 23/3121 |
| 2020/0303295 | A1 * | 9/2020 | Ichikawa | H01L 21/4842 |

FOREIGN PATENT DOCUMENTS

| | | | | |
|---|---|---|---|---|
| JP | S63-66956 | A | | 3/1988 |
| JP | 02012861 | A | * | 1/1990 |
| JP | H05-267524 | A | | 10/1993 |
| JP | H06-37223 | A | | 2/1994 |
| JP | 07030044 | A | * | 1/1995 |
| JP | 07211849 | A | * | 8/1995 |
| JP | 08008375 | A | * | 1/1996 |
| JP | H08-064737 | A | | 3/1996 |
| JP | 2000294711 | A | * | 10/2000 |
| JP | 2005-051109 | A | | 2/2005 |
| JP | 2007095852 | A | * | 4/2007 |
| JP | 2008177381 | A | * | 7/2008 |
| JP | 2013-004771 | A | | 1/2013 |
| JP | 2013004771 | A | * | 1/2013 |
| JP | 2015-090960 | A | | 5/2015 |
| JP | 2016-072376 | A | | 5/2016 |
| WO | 2017/154232 | A1 | | 9/2017 |

OTHER PUBLICATIONS

Tan CN201323195, English translation, 6 pages. Retrieved from the internet on Apr. 12, 2021: https://patents.google.com/patenUCN201323195Y/en?oq=201323195 (Year: 2021).*

Ebihara JP2000294711, English translation, 7 pages. Retrieved from the internet on Apr. 12, 2021: https://dialog.proquest.com/professional/docview/1381502518?accountid=131444 (Year: 2021).*

JP-2013004771-A, Asai, Machine Translation. (Year: 2013).*

An Office Action; "Notice of Reasons for Refusal", mailed by the Japanese Patent Office dated Mar. 1, 2022, which corresponds to Japanese Patent Application No. 2019-054863 and is related to U.S. Appl. No. 16/738,634; with English language translation.

* cited by examiner

F I G. 1
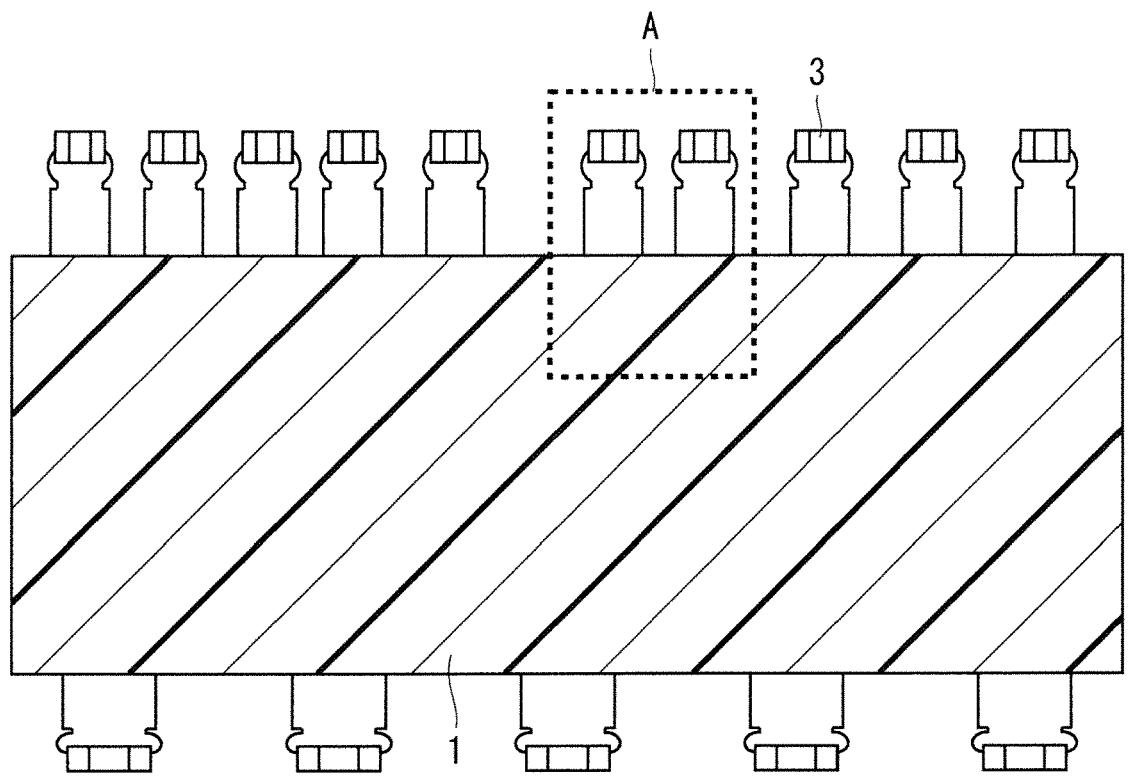
F I G. 2
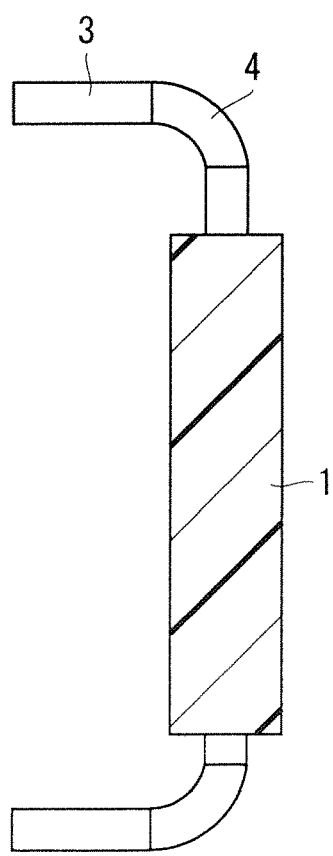

F I G. 5
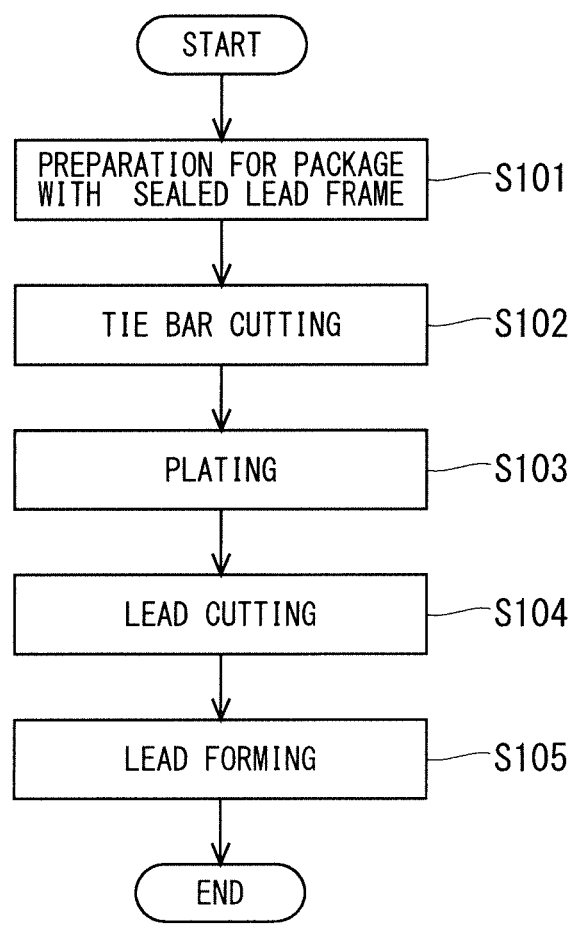

F I G. 1 4
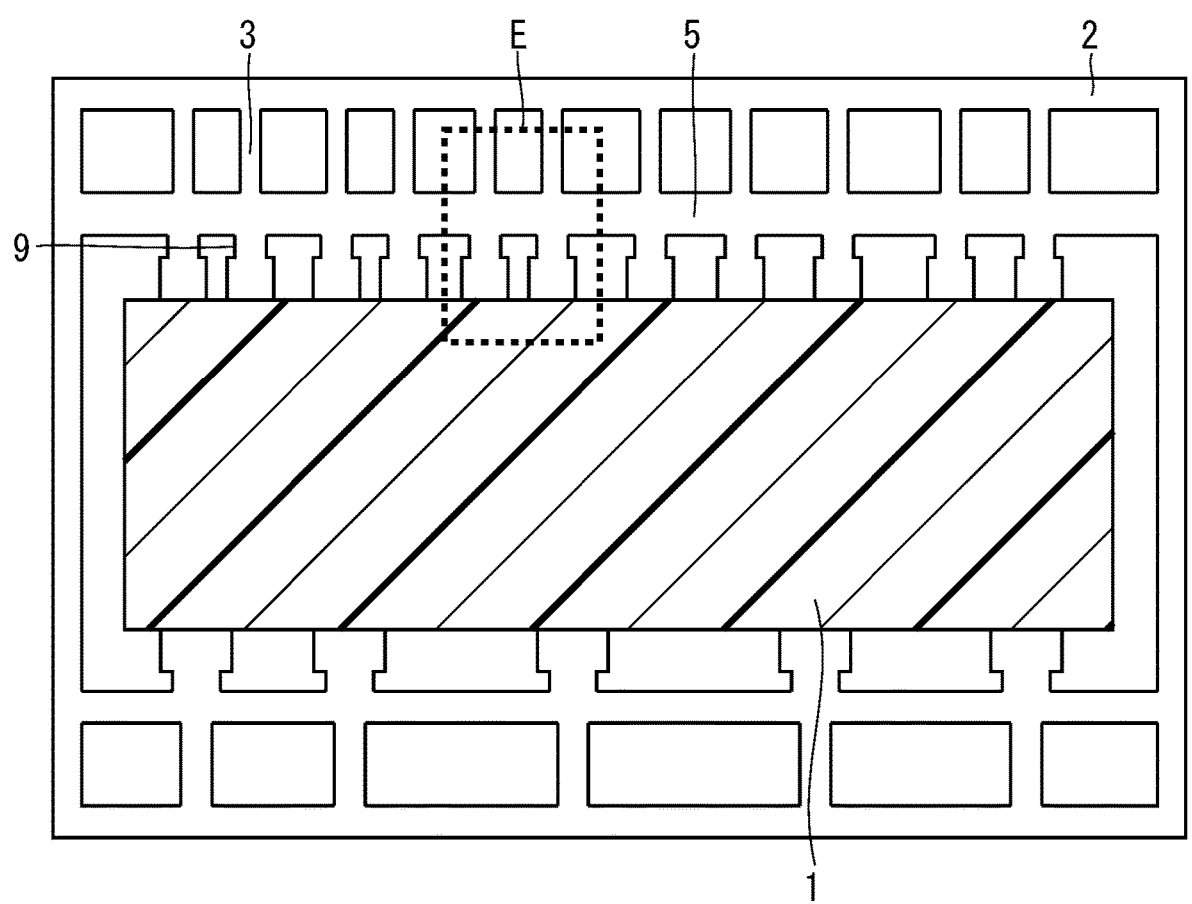

F I G. 1 5
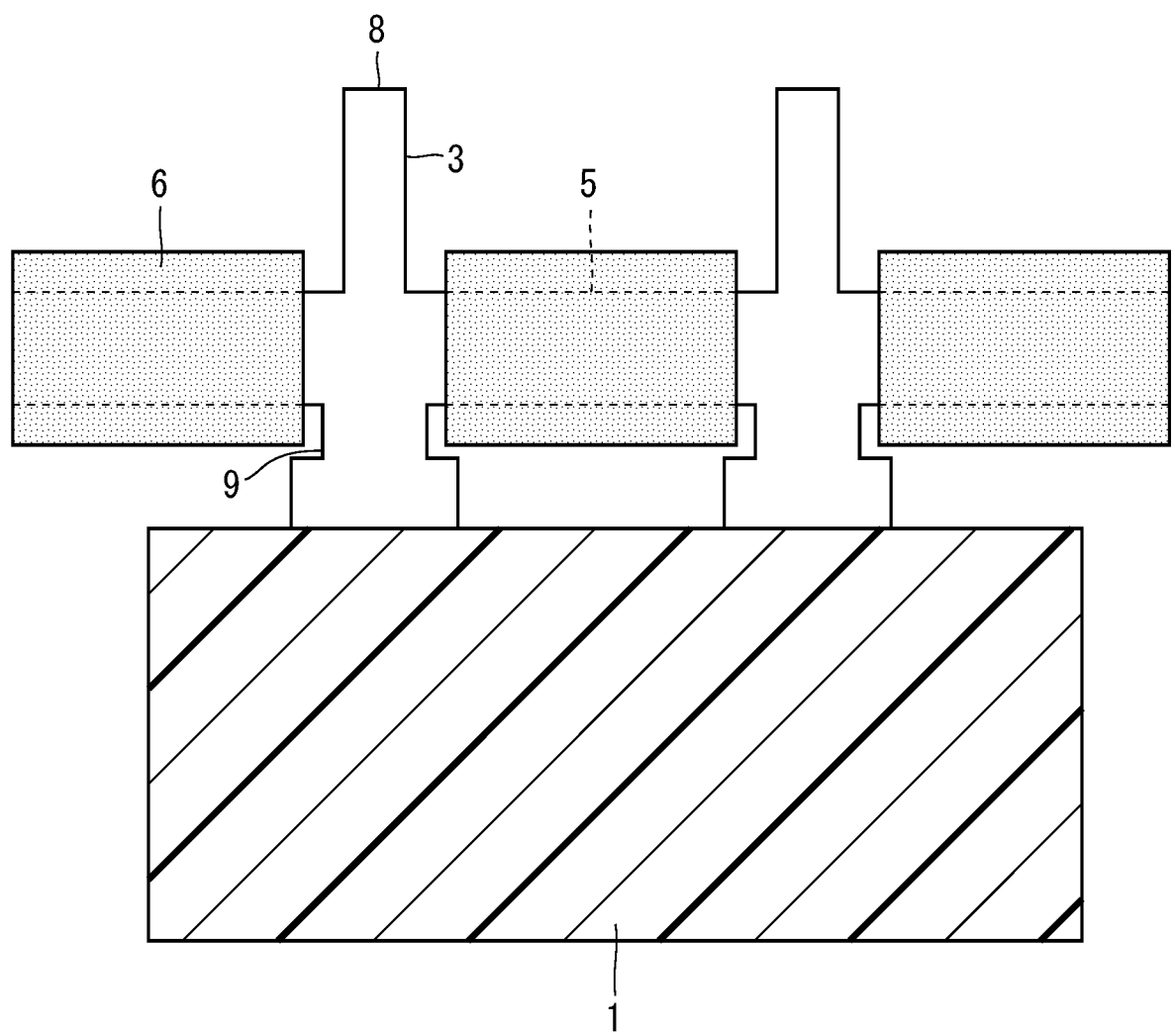

F I G. 1 6
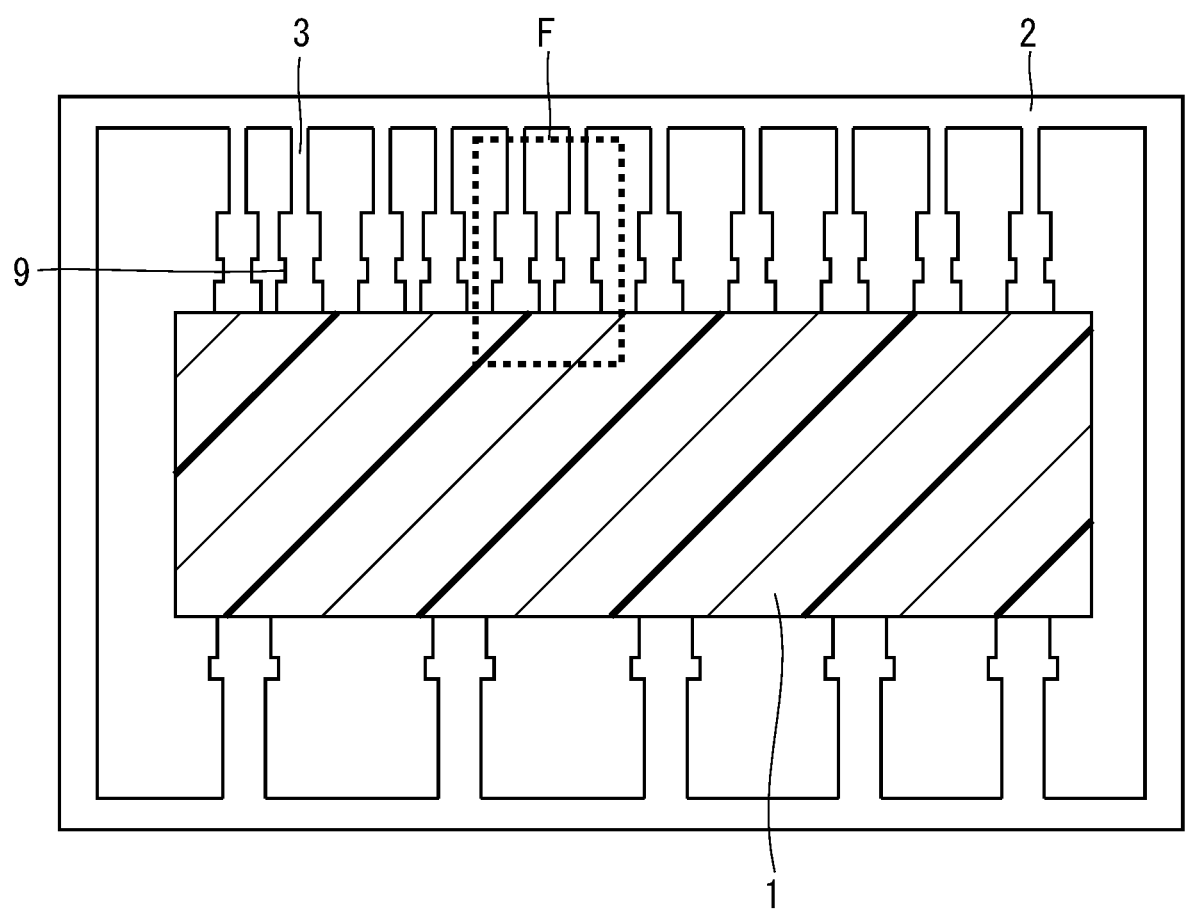

F I G. 2 6
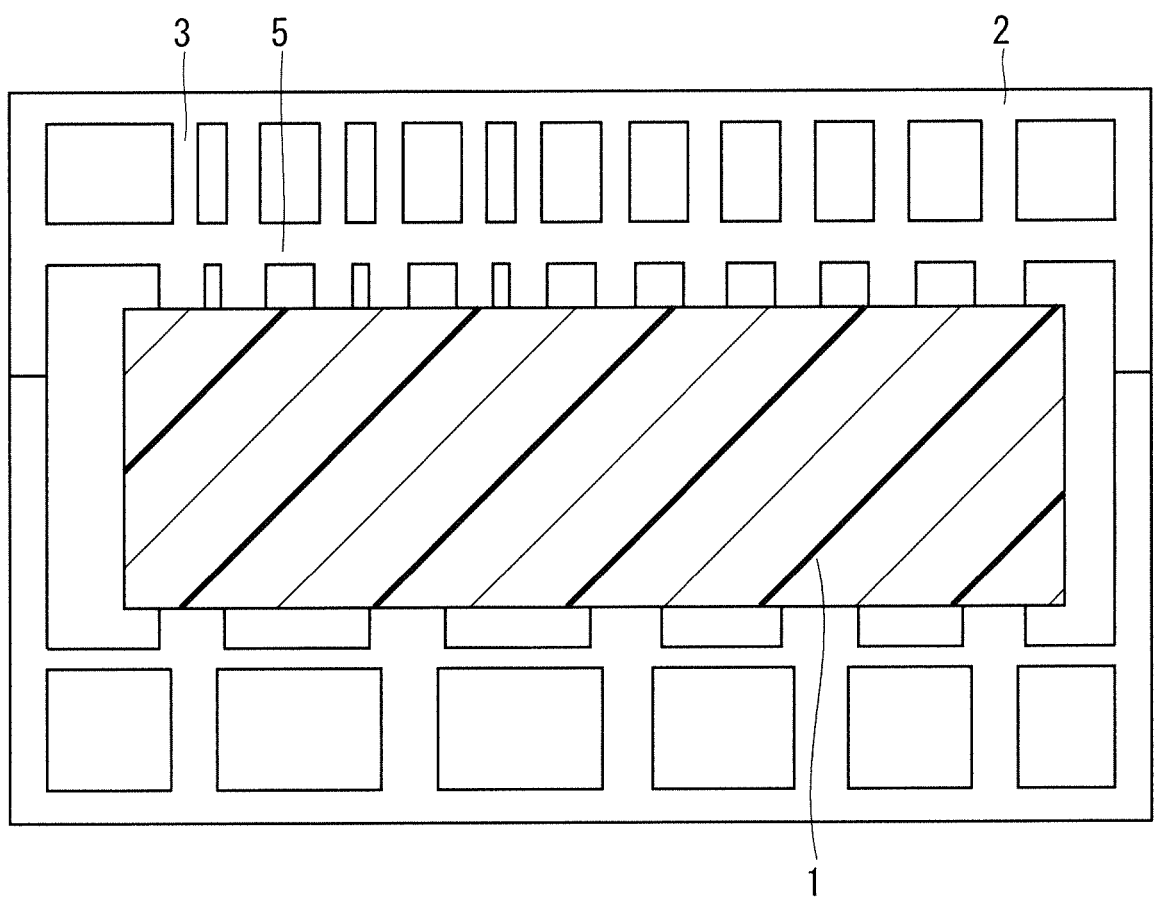

F I G. 2 7
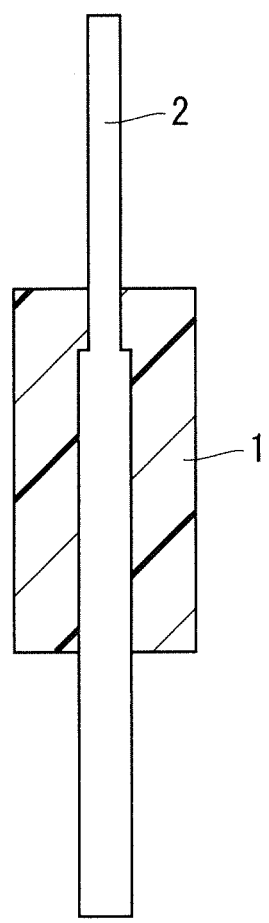

US 11,735,509 B2

POWER SEMICONDUCTOR DEVICE AND MANUFACTURING METHOD THEREOF

FIELD OF THE INVENTION

The present invention relates to a power semiconductor device using a lead frame and a manufacturing method thereof.

DESCRIPTION OF THE BACKGROUND ART

In a conventional semiconductor device using a lead frame, part of a terminal is cut and removed together with the tie bar so that insulation between adjacent terminals is not deteriorated with the portion being a trace of the tie bar cut that is remained after cutting the tie bars (see Japanese Patent Application Laid-Open No. 2013-4771 (Paragraphs 0024 and 0028, FIGS. 1 to 3 and FIG. 5)).

With such a terminal shape of the semiconductor device, the rigidity as the terminal cannot be secured, and after tie bar cutting and lead forming, the terminal is deformed and bent, and the tip positions of the terminals may be displaced. As a result, the insulation between the terminals and the insertion and mounting of the terminals into the through holes of a control board having a control circuit may be affected.

SUMMARY

The present invention has been made in view of the above problems, and an object of the present invention is to provide a power semiconductor device using a lead frame, in which insulation is secured between terminals and mounting onto a control board is facilitated.

The present invention is a power semiconductor device including a package in which a semiconductor element mounted on a lead frame is sealed, a plurality of terminals being bent and exposed from side surfaces of the package, and a terminal bending portion being a portion bend in each of the terminals, a width thereof being larger than a width of a tip of the terminal, and being equal to or smaller than the width of a contact portion of the terminal in contact with the package.

Insulation between the adjacent terminals and mountability onto a control board are readily secured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view illustrating a power semiconductor device according to Embodiment 1;

FIG. 2 is a side view illustrating the power semiconductor device according to Embodiment 1;

FIG. 5 is a flowchart illustrating a manufacturing method of the power semiconductor device according to Embodiment 1;

FIG. 14 is a plan view illustrating a package having a lead frame after sealing according to Embodiment 2;

FIG. 15 is a plan view illustrating tie bar cutting according to Embodiment 2;

FIG. 16 is a plan view illustrating the package after tie bar cutting according to Embodiment 2;

FIG. 26 is a plan view illustrating a package having a lead frame after sealing according to Embodiment 4;

FIG. 27 is a side view illustrating a package having a lead frame after sealing according to Embodiment 4;

DESCRIPTION OF THE PREFERRED EMBODIMENTS

Embodiment 1

Figure 3:
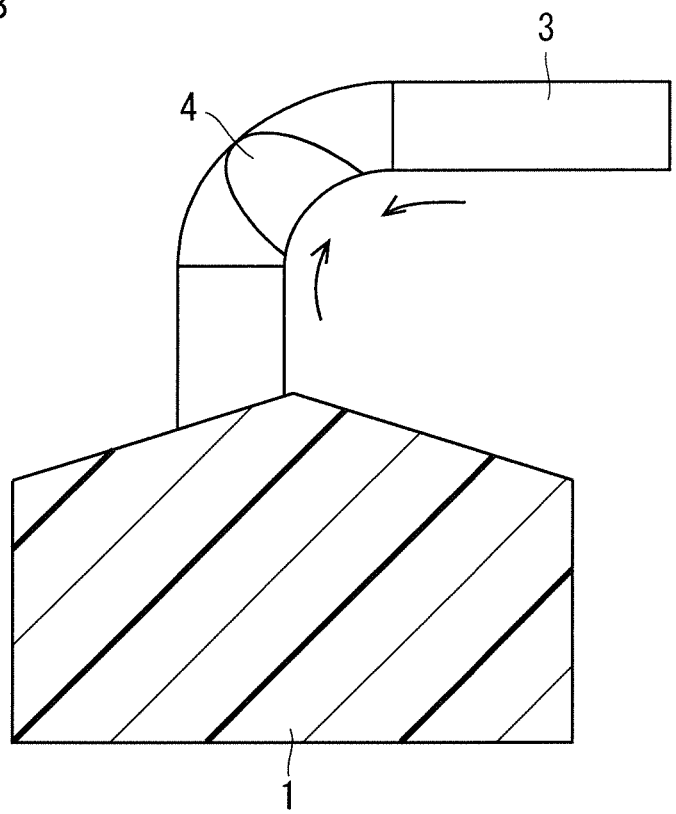
FIG. 3 is an enlarged side view illustrating the power semiconductor device according to Embodiment 1.

A configuration of a power semiconductor device according to Embodiment 1 will be described. FIG. 1 is a plan view illustrating the power semiconductor device according to Embodiment 1 and FIG. 2 is a side view illustrating the power semiconductor device when FIG. 1 is viewed from the right side of the drawing.

As illustrated in FIGS. 1 and 2, the power semiconductor device includes a package 1 and terminals 3 exposed from the package 1. The package 1 is sealed by transfer molding using resin. Inside the package 1, a semiconductor element is mounted on a lead frame 2, internally wired with a metal wire, and connected to the terminals 3. A plurality of terminals 3 are exposed from the package 1, and are inserted in through holes of a control board having a control circuit (not illustrated), thereby mounted thereon. Further, a required number of power semiconductor elements can be mounted in accordance with the specifications of the power semiconductor device. Illustration of the semiconductor element and metal wire inside the package 1 is omitted.

Although, the resin that seals the package 1 is composed using an epoxy resin, the resin is not limited thereto, and may be any resin that has a desired elastic modulus and adhesiveness.

The semiconductor element is, for example, an Insulated Gate Bipolar Transistor (IGBT), a Metal-Oxide-Semiconductor Field-Effect Transistor (MOSFET), or a diode. The material thereof is not limited to Si but may be SiC or GaN.

The metal wire is any one of an Al wire, an Au wire, an Ag wire, or a Cu wire, and is wired and connected inside of the package 1 by wire bonding. The metal wire material and the metal wire diameter are appropriately used according to the current capacity flowing through the metal wire.

The terminal 3 has a thickness of 0.3 to 1.0 mm, and is exposed from the opposite side surfaces of the package 1. Typically, the terminal 3 is formed of copper, it is not limited thereto, and it will not be specifically limited as long as a material has required heat dissipation characteristics. For example, Al may be used, a composite material such as copper/invar/copper may be used, or an alloy such as CuMo may be used.

Figure 4:
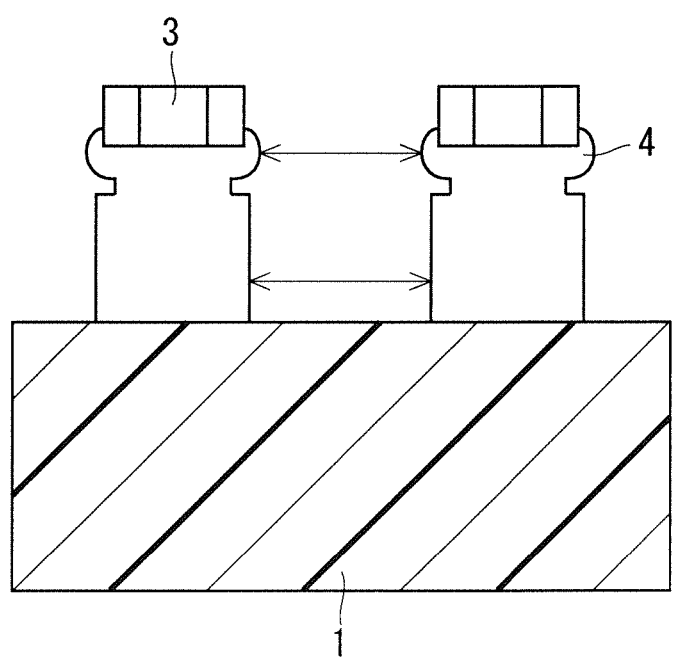
FIG. 4 is an enlarged plan view illustrating the power semiconductor device according to Embodiment 1.

FIG. 3 is a side view in which an area A surrounded by a broken line in FIG. 1 is extracted and enlarged. FIG. 4 is a plan view in which the area A surrounded by the broken line in FIG. 1 is extracted and enlarged.

As illustrated in FIGS. 2 and 3, the terminal 3 is subjected to bending processing by a lead forming die at a terminal bending portion 4 and is bent substantially at a right angle. The terminals 3 are bent from the back side toward the front side of the sheet of FIG. 1. At the terminal bending portion 4, compressive stresses are generated in the direction of the arrows illustrated in FIG. 3. Accordingly, the terminal bending portion 4 is deformed by bending with the lead forming die; therefore, the width in the longitudinal direction of the package 1 illustrated in FIG. 1, that is, in a direction toward the adjacent terminal 3 becomes larger than the width before it was subject to bending processing by the lead forming die.

However, as indicated by the arrows in FIG. 4, in the adjacent terminals 3, the spatial insulation distance of the terminal bending portions 4 is equal to or greater than the spatial insulation distance of the terminals 3 on the package 1 side.

Figure 10:
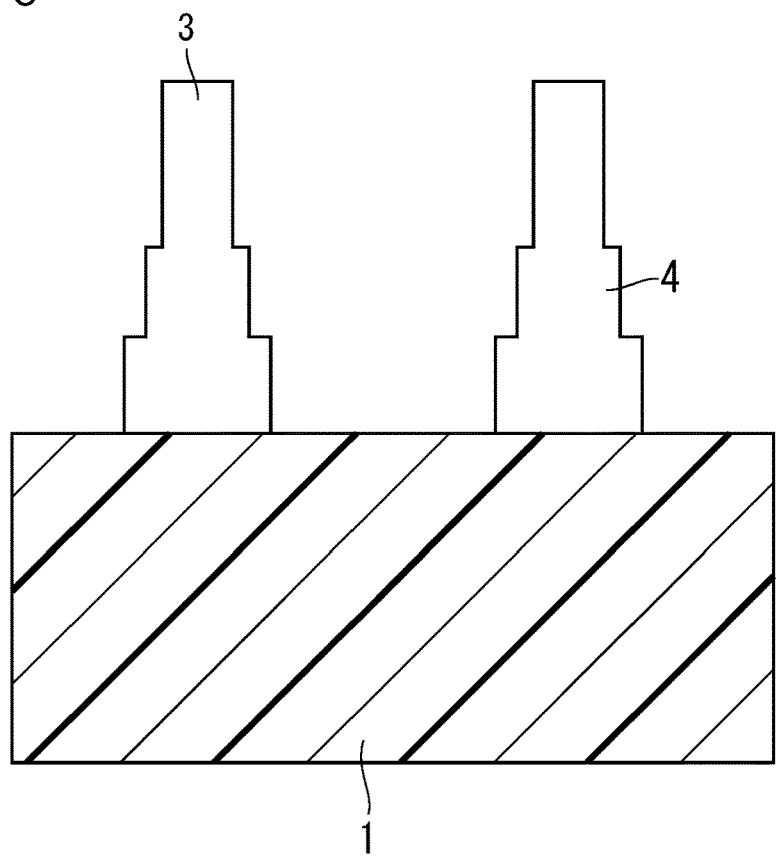
FIG. 10 is an enlarged plan view illustrating the package after lead cutting according to Embodiment 1.

The reason for this is that, as illustrated in FIG. 10 which illustrates the shapes before lead forming, when the width of the terminal bending portion 4 is made to be a shape having a smaller width than the width of a contact portion which is in contact with the package 1 of the terminal 3, the spatial insulation distance to the bending portion 4 of the adjacent terminal 3 can be secured in the terminal bending portion 4 that is deformed toward the adjacent terminal 3 after the lead forming. Note that the width of the tip of the terminal 3 to be mounted onto the control board is smaller than the width of the terminal bending portion 4.

Thus, insulation between the adjacent terminals 3 is secured. Further, the width the contact portion of the terminal 3 on the package 1 side is large and rigid; therefore, the misalignment of the tip positions of the plurality of terminals 3 is suppressed. Therefore, the power semiconductor device can be readily mounted onto the control board.

Next, a manufacturing method of the power semiconductor device will be described.

FIG. 5 illustrates a flowchart regarding the manufacturing method of the power semiconductor device.

Figure 6:
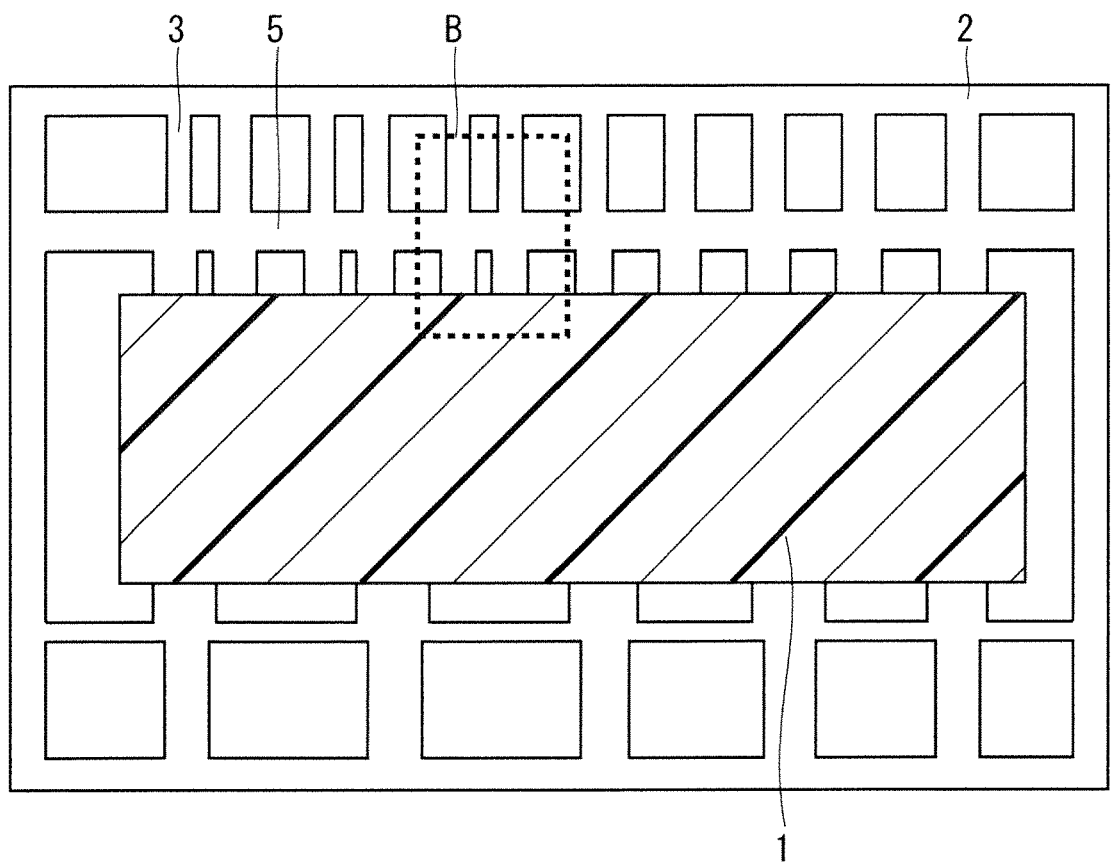
FIG. 6 is a plan view illustrating a package having a lead frame after sealing according to Embodiment 1.

First, a package 1 using a lead frame 2 sealed by transfer molding as illustrated in FIG. 6 is prepared (S101). A lead frame 2 includes terminals 3 and tie bars 5. The thickness of the lead frame 2 is 0.3 to 1.0 mm. Although not shown, the resin produced during the transfer molding is cut and removed.

Figure 7:
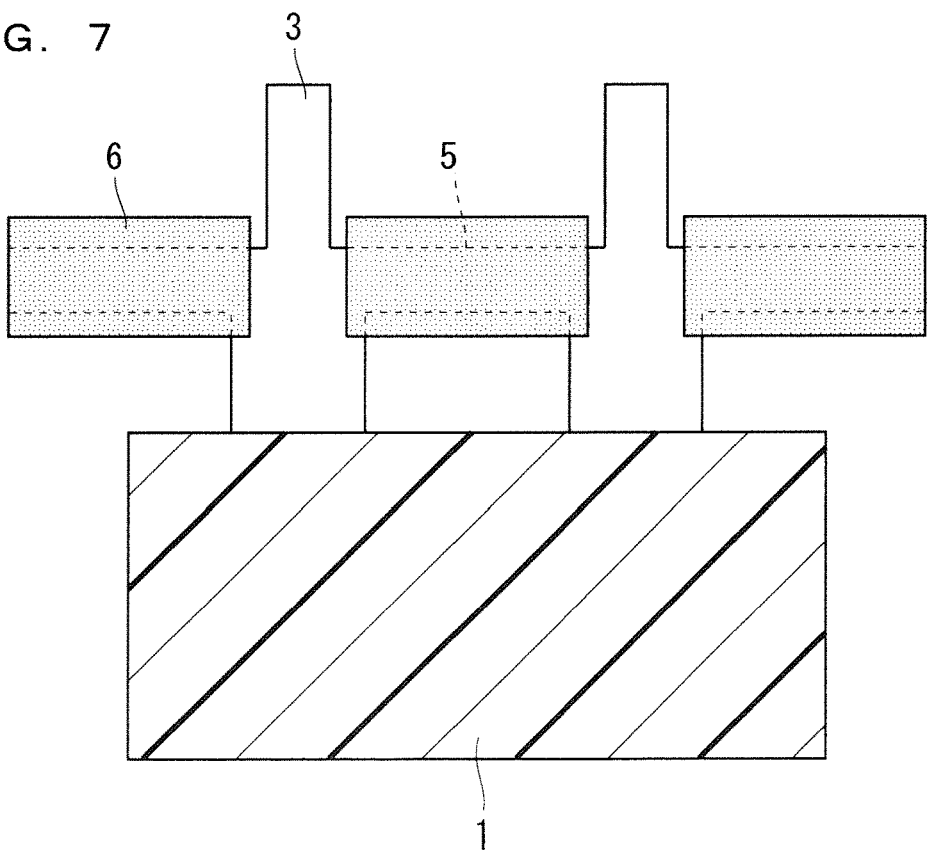
FIG. 7 is a plan view illustrating tie bar cutting according to Embodiment 1.
Figure 8:
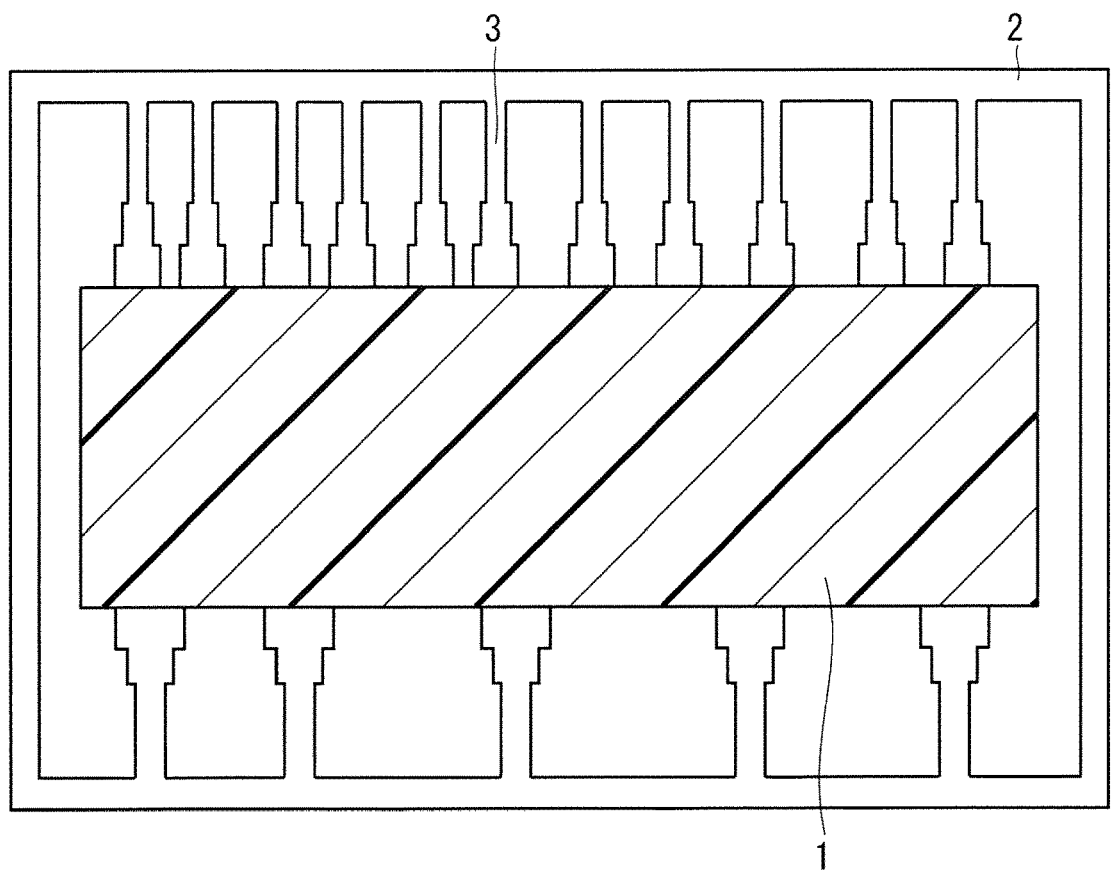
FIG. 8 is a plan view illustrating the package after tie bar cutting according to Embodiment 1.
Figure 9:
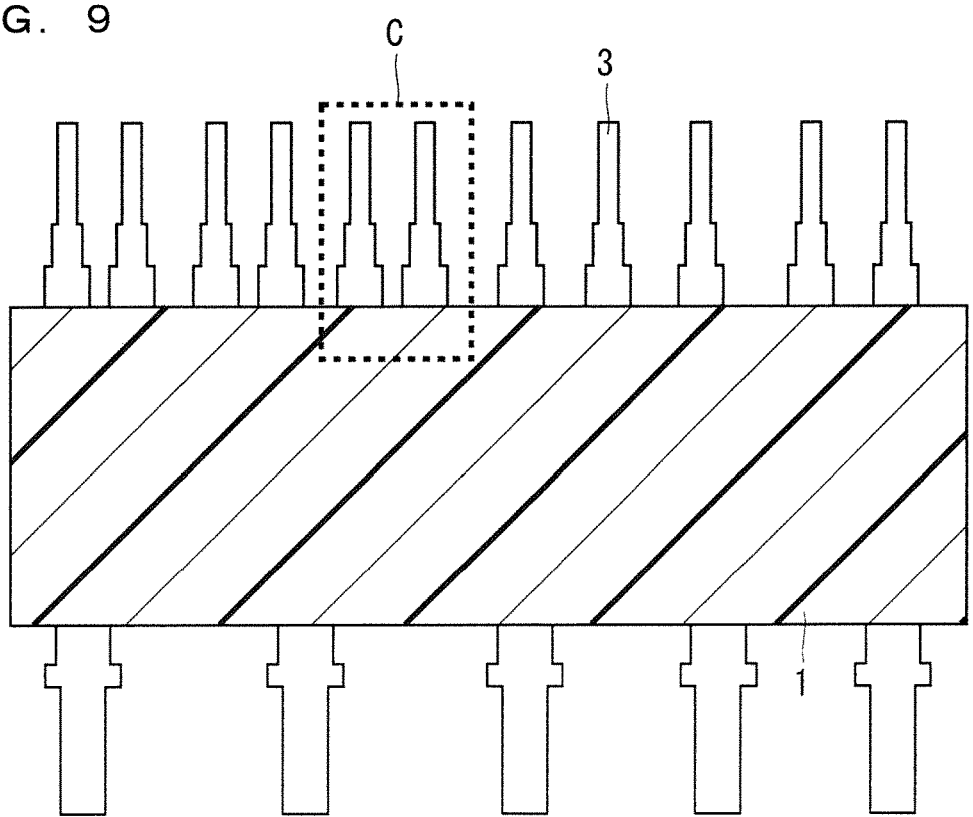
FIG. 9 is a plan view illustrating the package after lead cutting according to Embodiment 1.

Next, as illustrated in FIG. 7 which is a plan view in which the area B in FIG. 6 is extracted and enlarged, the tie bar cut die 6 is used to perform shearing to cut and remove the tie bars 5 (S102). A plan view after cutting the tie bars is shown in FIG. 8. Thereafter, the lead frame 2 including the terminals 3 illustrated in FIG. 8 is plated (S103). For plating, Sn-based plating is performed. After plating, the leads of the lead frame 2 are cut and removed by shearing using the lead cut die (S104). A plan view after lead cutting is illustrated in FIG. 9. Further, FIG. 10 illustrating a plan view in which the area C in FIG. 9 is extracted and enlarged.

Thus, in adjacent terminals 3, the width of the terminal bending portion 4 is larger than the width of the tip of the terminal 3 to be mounted onto the control board and smaller than the width of the terminal 3 in contact with the package 1, therefore, the spatial insulation distance of the terminal bending portion 4 before lead forming is greater than the spatial insulation distance of the contact portion of the terminal 3 on the package 1 side. From the state of FIG. 9, the terminals 3 are bent by the lead forming die, and the power semiconductor device having the terminals 3 illustrated in FIG. 1 is obtained (S105). Although when the terminals 3 illustrated in FIG. 9 are lead-formed, the terminals 3 are deformed toward the adjacent terminals due to the compressive stress on the terminal bending portions 4, the spatial insulation distance at the terminal bending portions 4 of the adjacent terminals 3 becomes equal to or greater than the spatial insulation distance of the contact portion of the terminal 3 on the package 1 side.

Therefore, a spatial insulation distance is secured between the adjacent terminals 3; therefore, insulation against an adjacent terminal 3 having a different polarity is secured. Further, the width of a terminal 3 is larger on the package 1 side than a tip portion to be mounted on the control board (wider by 1.5 to 4 times), rigidity can be secured. That is, deformation and bending of the terminals 3 can be suppressed even after lead cutting. Therefore, insertion and mounting of the terminals 3 onto the control board can be facilitated.

In addition, power semiconductor devices realize energy savings; therefore, the devices are used in a wide range of applications, including industrial applications. And development in high-output devices is ongoing with currents ranging from several A class to 20 to 75 A class, and element breakdown voltage from 600 V class to 1200 V class. However, it is difficult to change the arrangement of the terminals 3 in addition to the size of the package 1 because of the size restriction of the system using the power semiconductor device and the requirement to mount the device on the same control circuit.

However, the power semiconductor device and the manufacturing method thereof according to Embodiment 1 ensure dealing with each specification including a high output specification, so that commonized packages 1 and terminals 3 are provided without changing the arrangement of the terminals 3 of the package 1. For example, if the spatial insulation distance between adjacent terminals 3 is insufficient, a necessary spatial insulation distance between the adjacent terminals 3 is secured without changing the shape of the lead frame 2 and the expensive molding die, only by adjusting the tie bar die 6, which allows cutting of tie bars 5 according to the insufficiency of the spatial insulation distance, and bending of the terminals by lead forming.

In Embodiment 1, in the package 1 in which the semiconductor element is sealed, and having the lead frame 2, the tie bars are cut to have a width smaller than the width of a contact portion of the terminal 3 in contact with the package 1, then the width of the bent terminal bending portion 4 exposed from the side surface of the package is equal to or smaller than the width of the contact portion of the terminal 3 in contact with the package 1 through plating, lead cutting, and lead forming. With the above configuration, a spatial insulation distance between adjacent terminals 3 is secured, and insulation between adjacent terminals 3 is secured. Further, the width of the terminal 3 on the package 1 side is large and secures rigidity, the terminal 3 is not deformed or bent. Therefore, mounting of the terminals 3 onto the control board can be facilitated.

Also, in accordance with specification of power semiconductor devices, the necessary spatial insulation distance is secured between the adjacent terminals 3 by adjusting the tie bar cut die 6 without changing the positions of the package 1 and the terminals 3. Also, mounting onto the same control board is ensured.

All shapes of terminals 3 are not necessarily to be the same. When there is a sufficient distance between adjacent terminals 3 like the terminals on the lower side of the sheet of paper of FIG. 1 illustrating the plane of the power semiconductor device and the spatial insulation distance between the terminal bending portions 4 of the adjacent terminals 3 can be secured sufficiently after lead forming, the adjacent terminals 3 does not need to be shaped like the terminal 3 having a stepped shape as illustrated in FIG. 10, and the width of the terminal bending portion 4 illustrated in FIG. 10 may be the same straight shape as the width of the terminal 3 in contact with the package. In other words, after lead forming, it is only necessary to secure a required spatial insulation distance between the adjacent terminal bending portions 4 according to the specification of the power semiconductor device and insulation between the terminals 3.

Further, the Embodiment 1 can be applied not only to a power semiconductor device that is inserted into a through hole of a control board and mounted thereon, but also to a power semiconductor device that is surface-mounted onto a control board. Only the shape after lead forming is different.

Embodiment 2

Figure 11:
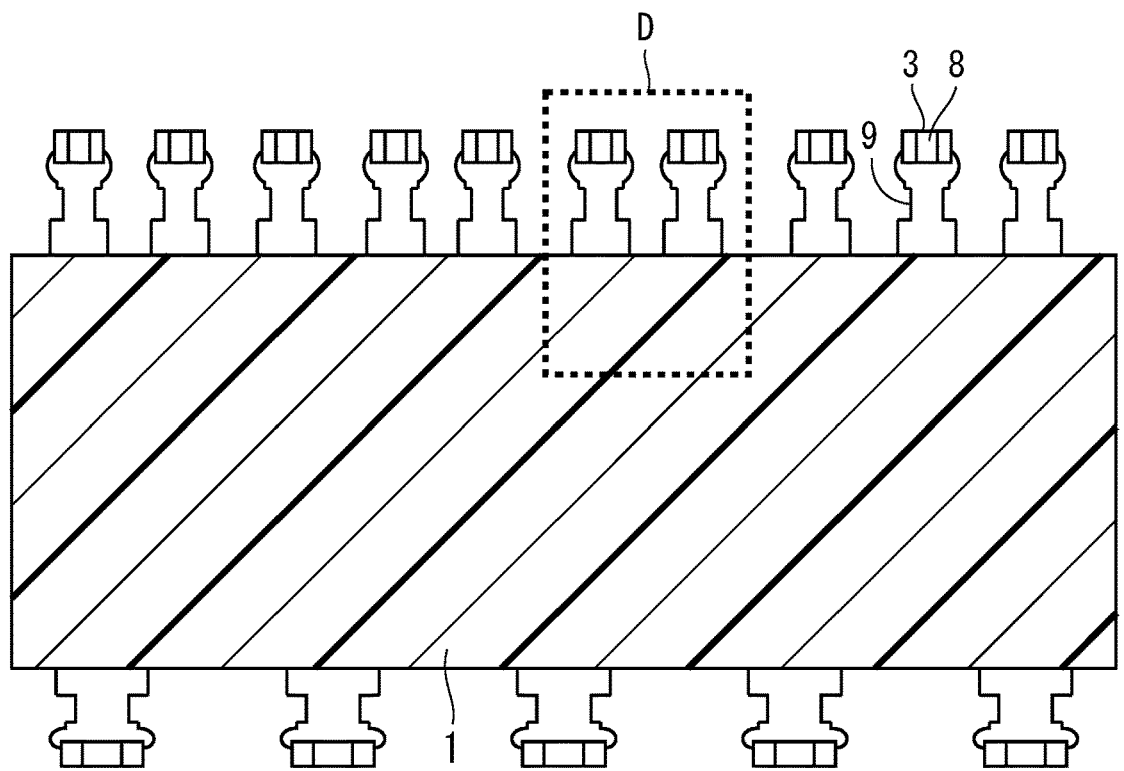
FIG. 11 is a plan view illustrating a power semiconductor device according to Embodiment 2.
Figure 12:
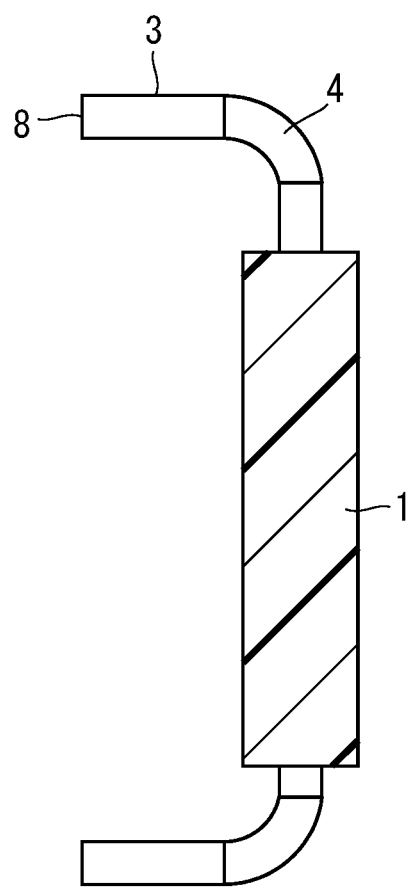
FIG. 12 is a side view illustrating the power semiconductor device according to Embodiment 2.

FIG. 11 is a plan view illustrating a power semiconductor device according to Embodiment 2 and FIG. 12 is a side view illustrating the power semiconductor device according to Embodiment 2. Note that the power semiconductor device and the manufacturing method thereof in Embodiment 2 have many configurations in common with that of Embodiment 1. Therefore, differences from the power semiconductor device and the manufacturing method thereof according to Embodiment 1 will be described, and the same or corresponding components will be denoted by the same reference numerals and description thereof will be omitted. As illustrated in FIGS. 13 and 15 to 17, Embodiment 2 is different from Embodiment 1 in that the terminal bending portion 4 of the terminal 3 on the package 1 side is provided with concaves 9 on the adjacent terminal 3 sides.

Figure 13:
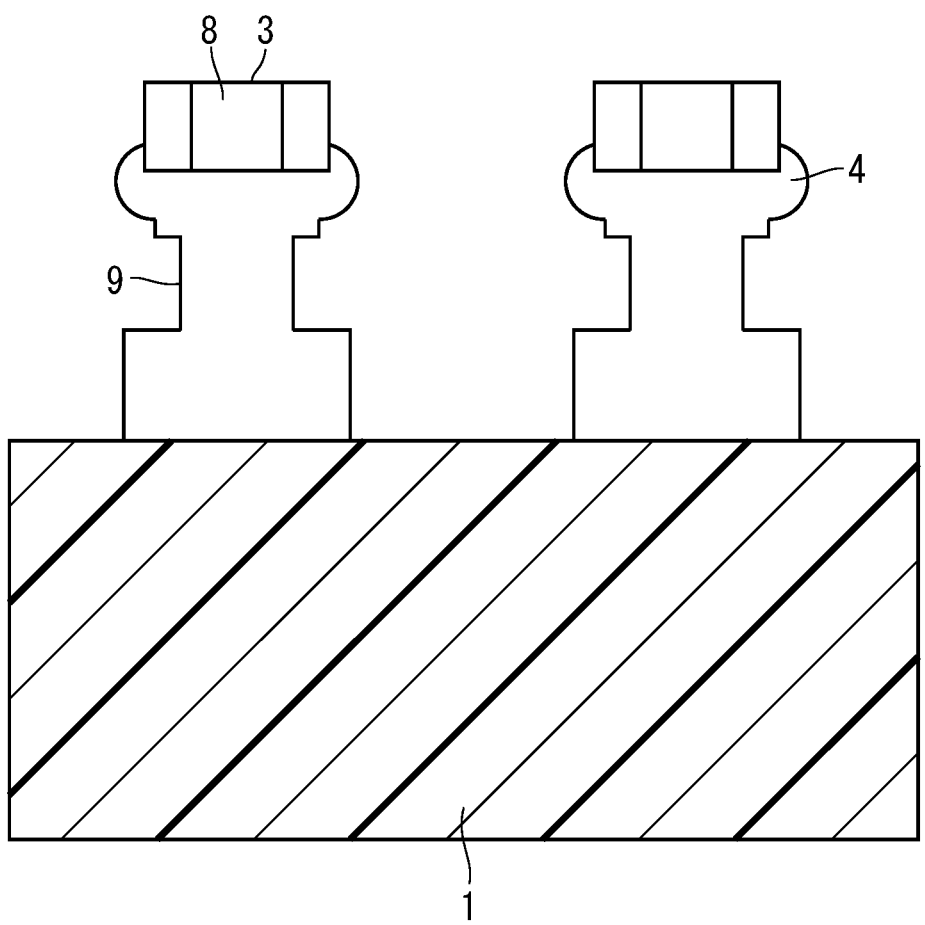
FIG. 13 is an enlarged plan view illustrating the power semiconductor device according to Embodiment 2.

FIG. 13 is a plan view in which an area D surrounded by the broken line in FIG. 11 is enlarged. Similar to Embodiment 1, in the adjacent terminals 3, the spatial insulation distance of the terminal bending portions 4 is equal to or greater than the spatial insulation distance of the contact portion of the terminals 3 on the package 1 side.

Depending on the frequency of use of the tie bar cut die 6, whisker-like burrs may occur in the tie bar cut process due to the effects of die wear, die corner blunting, clearance, and the like.

Therefore, as illustrated in FIG. 15 which is a plan view of the area E surrounded by the broken line in FIG. 14 is enlarged, concave notches in the width direction are provided on both sides of the terminal 3 from the tie bar 5 toward the package 1 side. Note that the width of the terminal 3 at the concave portion is larger than the tip width of the terminal 3. Therefore, the rigidity of the terminal 3 can be secured.

In this manner, the tie bars are cut in a state where the corner portions of the tie bar cut die 6 do not contact with the tie bars 5. Thereby, the generation of burrs can be suppressed in the tie bar cutting process. Moreover, the service life of the expensive tie bar cut die 6 can be improved. A plan view after tie bar cutting is illustrated in FIG. 16.

Next, lead cutting of the lead frame 2 is performed (FIG. 17), and a power semiconductor as illustrated in FIGS. 11 and 12 can be obtained by lead forming.

Figure 17:
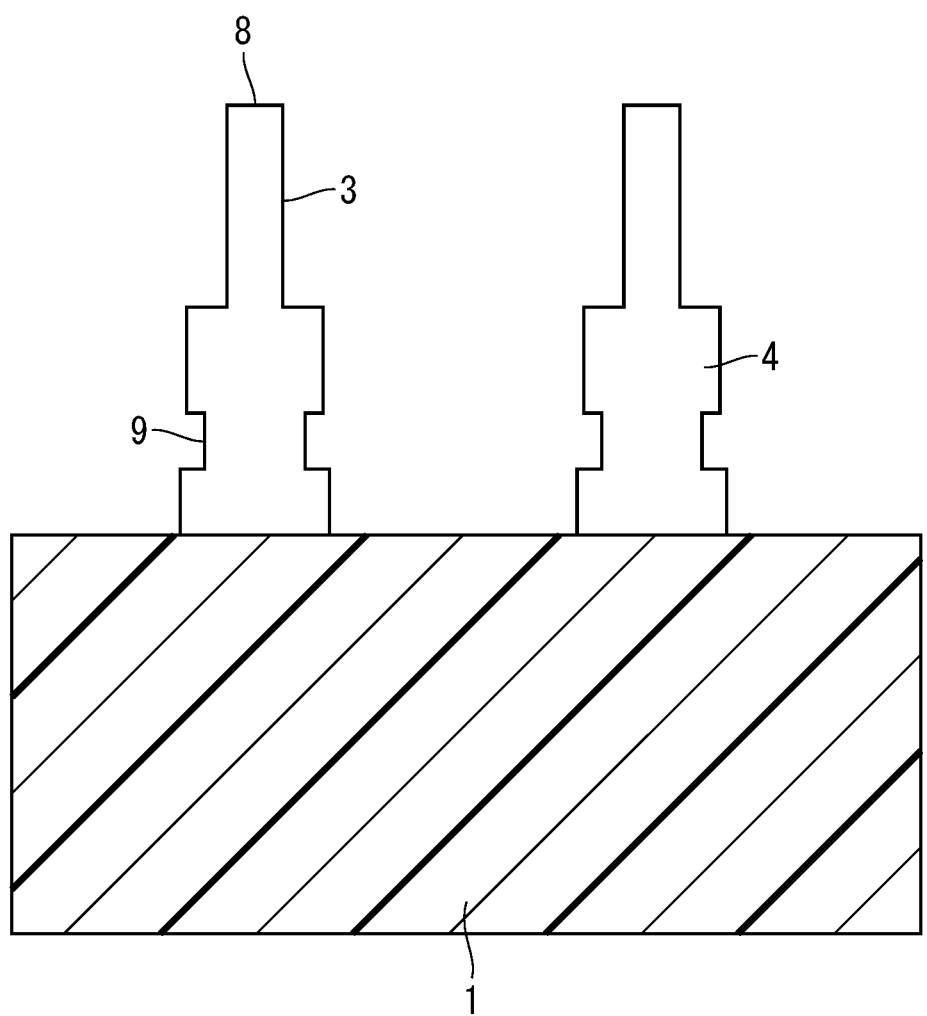
FIG. 17 is an enlarged plan view illustrating the package after lead cutting according to Embodiment 2.

As illustrated in FIG. 17, the width of the terminal bending portion 4 is smaller than the width of the contact portion of the terminal 3 in contact with the package, thereby the spatial insulation distance between the terminal bending portions 4 can be secured after lead forming. Note that the width of the tip 8 of the terminal 3 to be mounted onto the control board is smaller than the width of the terminal bending portion 4.

Also in Embodiment 2, in the package 1 in which the semiconductor element is sealed, and having the lead frame 2, the tie bars 5 are cut to have a width smaller than the width of a contact portion of the terminal 3 in contact with the package 1 without placing a burden on the tie bar cut die 6, then the width of the bent terminal bending portion 4 of the terminal 3 that is bent and exposed from the side surface of the package 1 is equal to or smaller than the width of the contact portion of the terminal 3 in contact with the package 1 through plating, lead cutting, and lead forming. With the above configuration, a spatial insulation distance between adjacent terminals 3 is secured, and insulation between adjacent terminals 3 is secured. Further, the width of the terminal 3 on the package 1 side is large and secures rigidity; therefore, mounting of the terminals 3 onto the control board can be facilitated without deforming or bending the terminal 3.

Also, in accordance with specification of power semiconductor devices, the spatial insulation distance is secured between the adjacent terminals 3 by adjusting the tie bar cut die 6 without changing the positions of the package 1 and the terminals 3. Also, mounting onto the same control board is ensured.

Further, generation of burrs in the tie bar cutting process is suppressed, and a spatial insulation distance between adjacent terminals 3 is secured, Moreover, the service life of the tie bar cut die can be improved.

Embodiment 3

Figure 18:
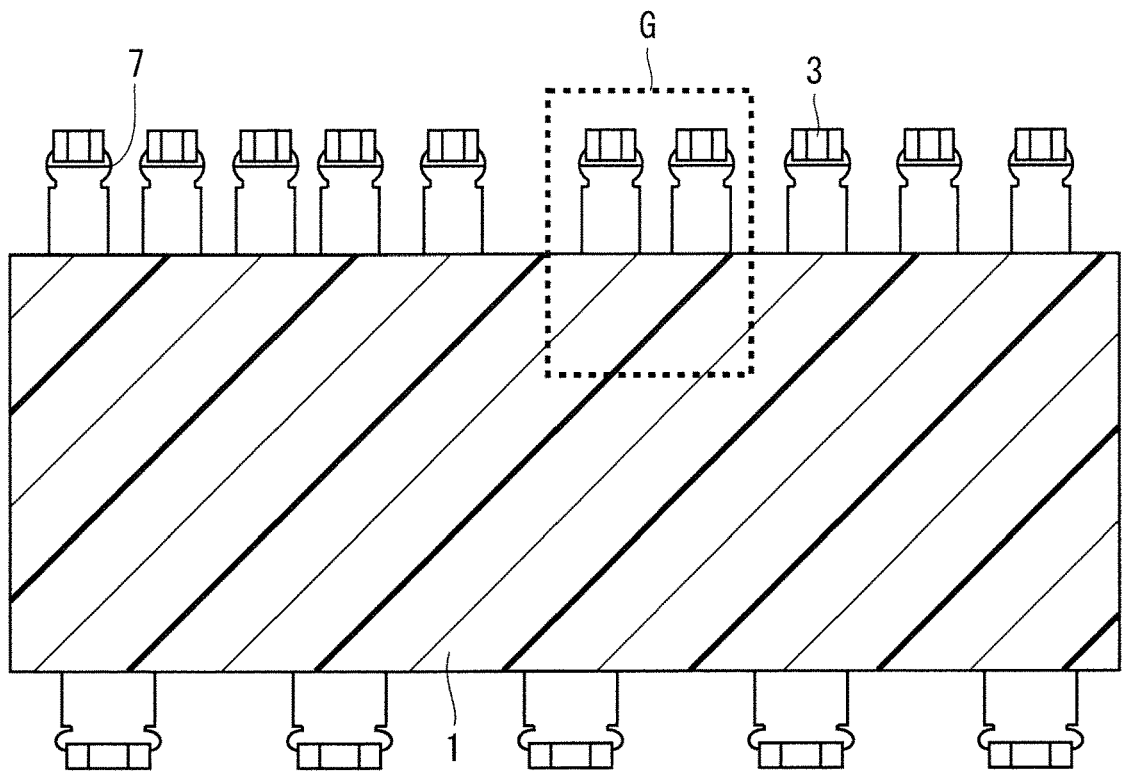
FIG. 18 is a plan view illustrating a power semiconductor device according to Embodiment 3.
Figure 19:
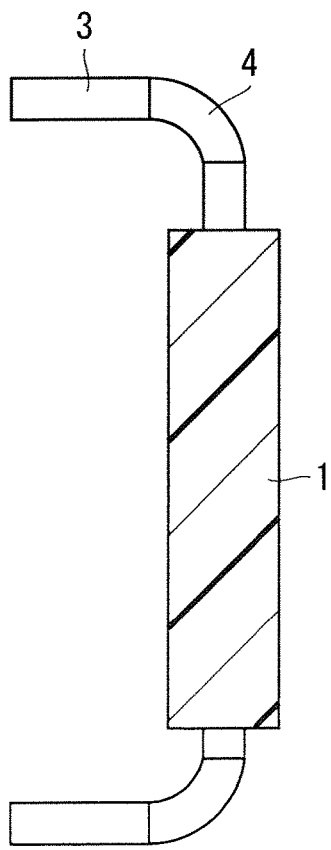
FIG. 19 is a side view illustrating the power semiconductor device according to Embodiment 3.

FIG. 18 is a plan view illustrating a power semiconductor device according to Embodiment 3 and FIG. 19 is a side view illustrating the power semiconductor device according to Embodiment 3. Note that the power semiconductor device and the manufacturing method thereof in the Embodiment 3 have many configurations in common with that of Embodiment 1. Therefore, differences from the power semiconductor device and the manufacturing method thereof according to Embodiment 1 will be described, and the same or corresponding components will be denoted by the same reference numerals and description thereof will be omitted. As illustrated in FIGS. 18 and 20 to 23, Embodiment 3 is different from Embodiment 1 in that inside of the terminal bending portion 4 of the terminal 3 is provided with grooves 7 by coining.

As illustrated in FIG. 18, similar to Embodiment 1, in the adjacent terminals 3, the spatial insulation distance of the terminal bending portions 4 is equal to or greater than the spatial insulation distance of the contact portion of the terminals 3 on the package 1 side.

Figure 20:
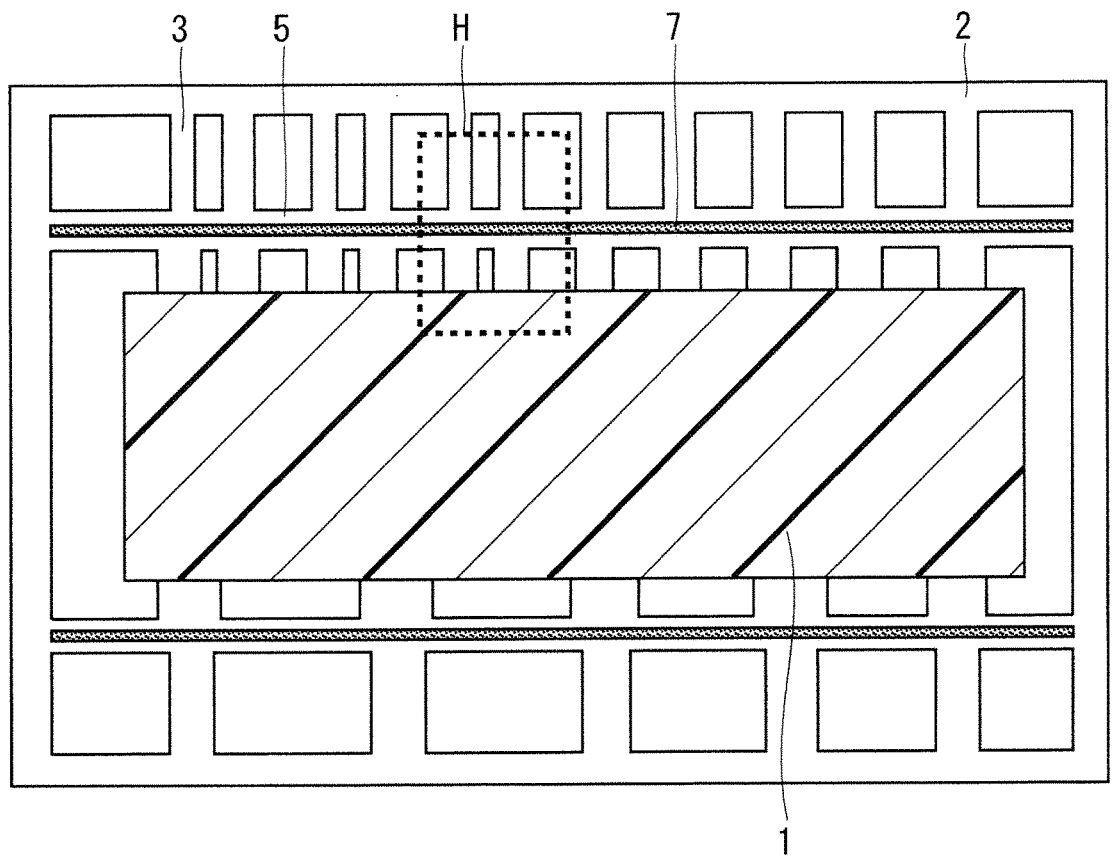
FIG. 20 is a plan view illustrating a package having a lead frame after sealing according to Embodiment 3.
Figure 21:
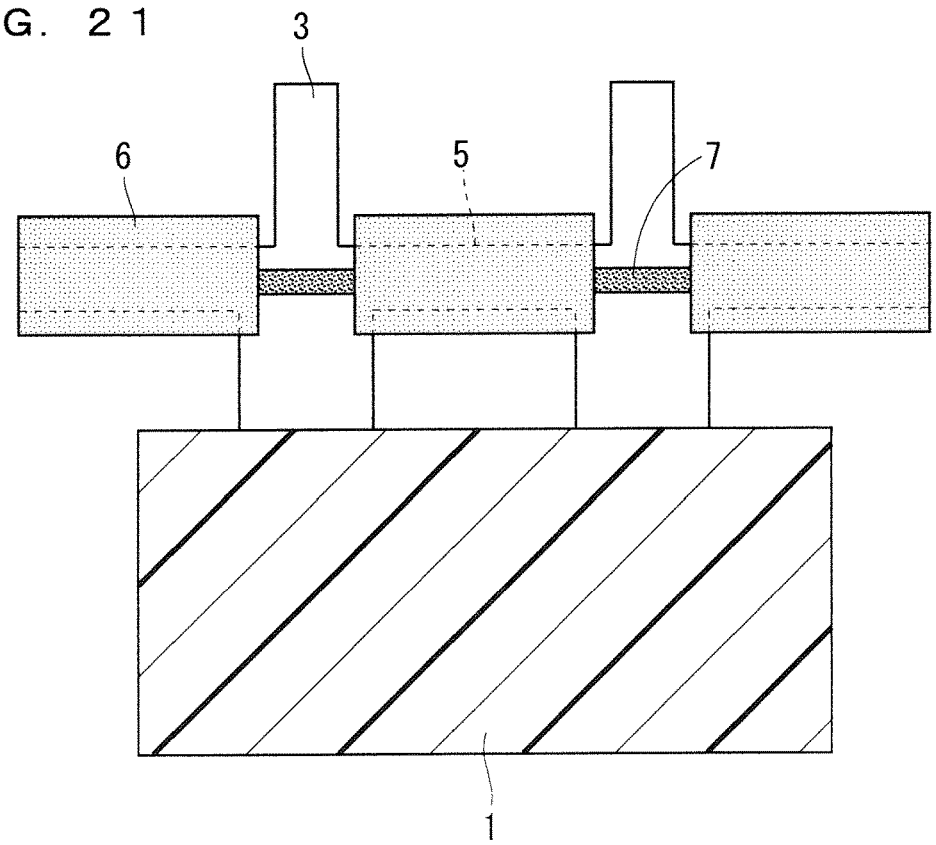
FIG. 21 is a plan view illustrating tie bar cutting according to Embodiment 3.
Figure 22:
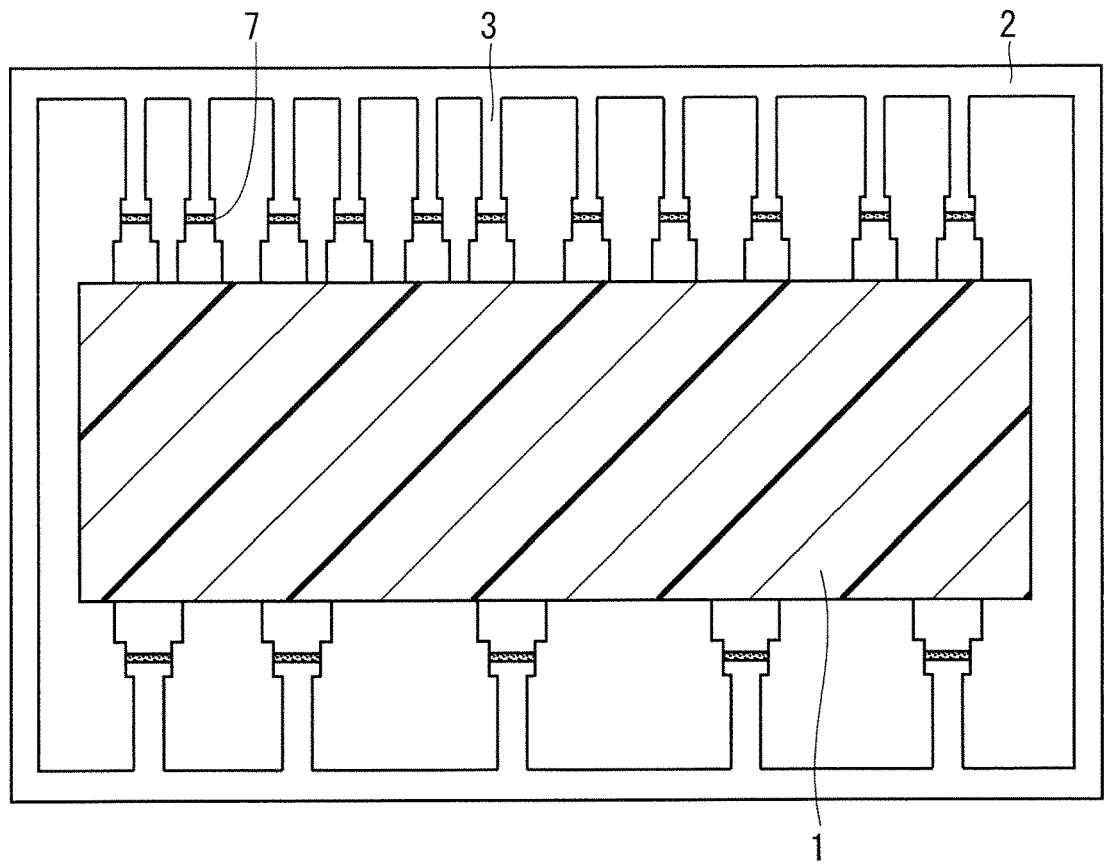
FIG. 22 is a plan view illustrating the package after tie bar cutting according to Embodiment 3.
Figure 23:
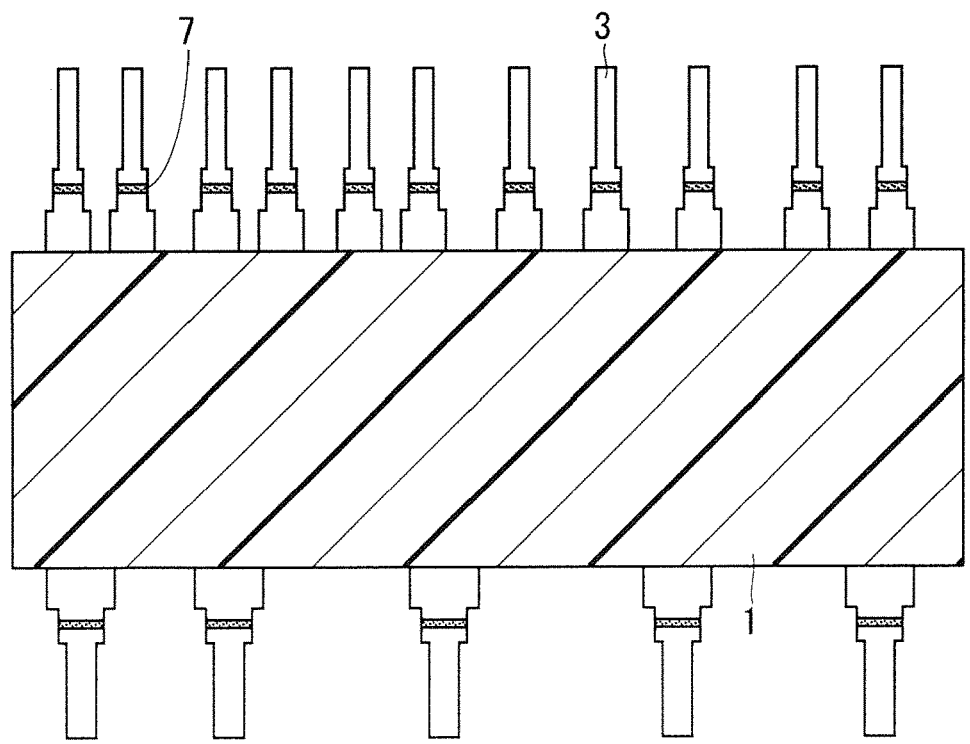
FIG. 23 is a plan view illustrating the package after lead cutting according to Embodiment 3.

A package 1 having a lead frame subjected to coining is illustrated in FIG. 20. In the tie bar 5 corresponding to the terminal bending portion 4 in the lead forming process, a groove 7 having a depth of about 20% with respect to the thickness of the lead frame 2 is provided. Coining excels in productivity because it performs press processing to form recesses.

Next, as in Embodiment 1, by performing tie bar cutting (FIGS. 21 and 22), plating, cutting and removing the leads of the lead frame 2 (FIG. 23), and lead forming, the power semiconductor device as illustrated in FIGS. 18 and 19 is obtained.

The lead frame 2 is coined to allow the terminals 3 to be readily bent with high precision in the lead forming process; therefore, the spatial insulation distance between the adjacent terminals 3 is secured as intended. Also, in mounting onto the control board, the misalignment of the tip positions of the terminals 3 is suppressed by accurate bending, and the mounting is readily performed.

Also in Embodiment 3, in the package 1 in which the semiconductor element is sealed, and having the lead frame 2, cutting, plating, lead cutting, and lead forming of the tie bars 5 are readily performed with high precision to have a width smaller than the width of the terminal 3 in contact with the package 1. The width of the terminal 3 that is bent and exposed from the side surface of the package 1 is equal to or smaller than the width of the terminal 3 in contact with the package 1. With the above configuration, a spatial insulation distance between adjacent terminals 3 is secured, and insulation between adjacent terminals 3 is secured. Further, the width of the terminal 3 on the package 1 side is large and secures rigidity; therefore, mounting of the terminals 3 onto the control board can be facilitated without deforming or bending the terminal 3.

Also, in accordance with specification of power semiconductor devices, the spatial insulation distance is secured between the adjacent terminals 3 by adjusting the tie bar cut die 6 without changing the positions of the package 1 and the terminals 3. Also, mounting onto the same control board is ensured.

Coining may be performed not only on one surface of the lead frame but also on both surfaces.

Embodiment 4

Figure 24:
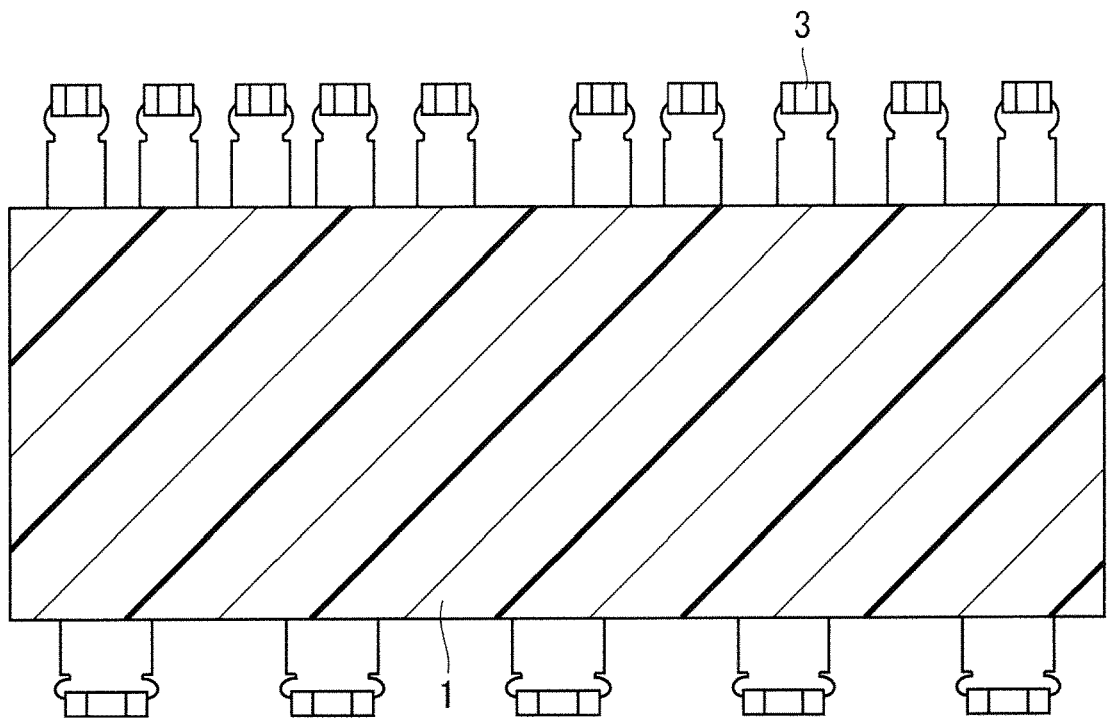
FIG. 24 is a plan view illustrating a power semiconductor device according to Embodiment 4.
Figure 25:
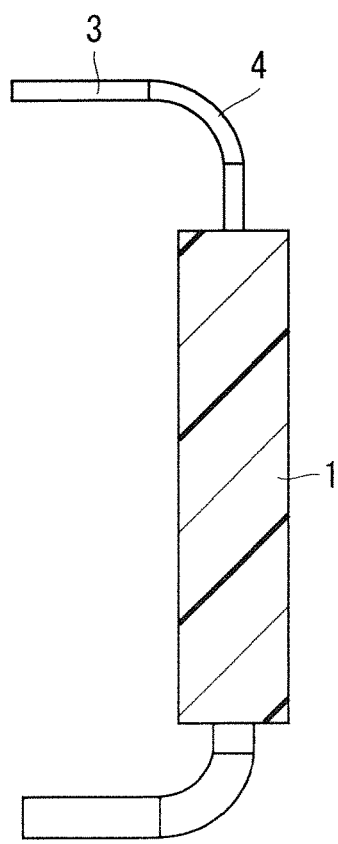
FIG. 25 is a side view illustrating the power semiconductor device according to Embodiment 4.
Figure 28:
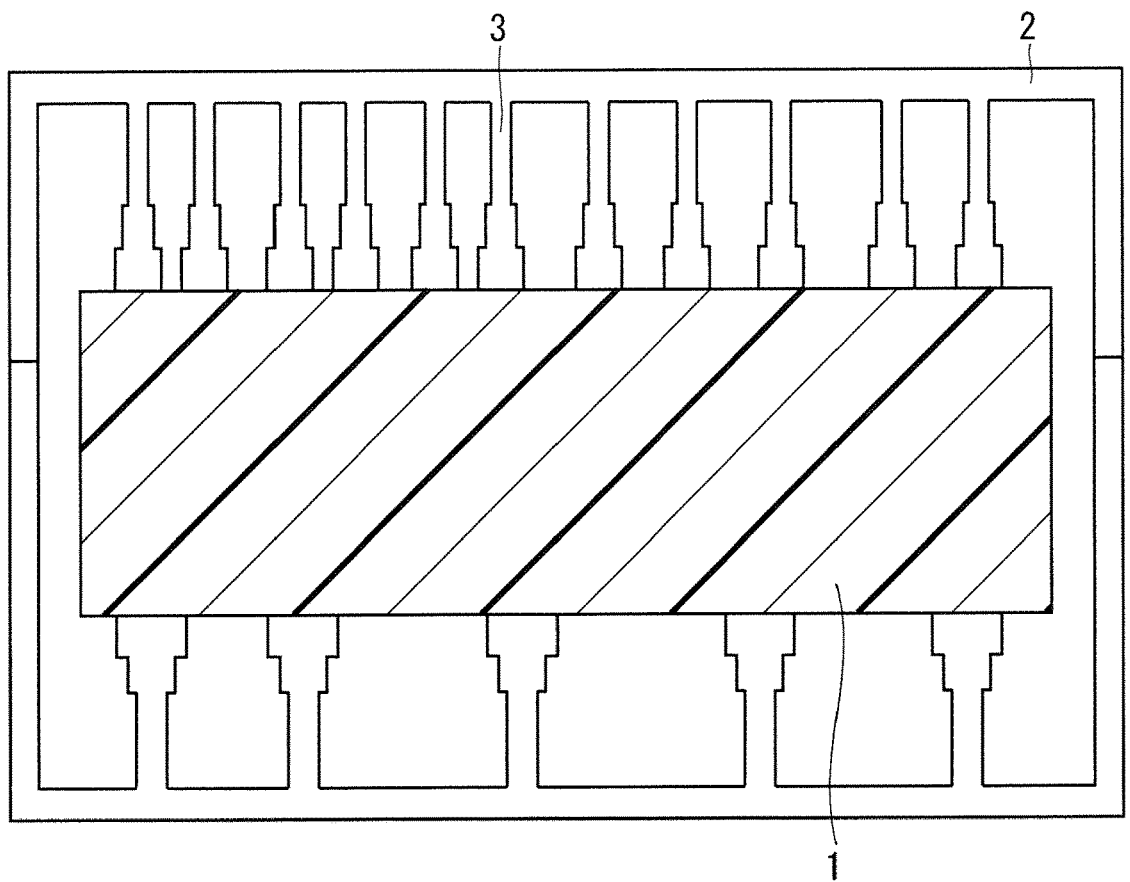
FIG. 28 is a plan view illustrating the package after tie bar cutting according to Embodiment 4.

FIG. 24 is a plan view illustrating a power semiconductor device according to Embodiment 4 and FIG. 25 is a side view illustrating the power semiconductor device according to Embodiment 4. the power semiconductor device and the manufacturing method thereof in the Embodiment 4 have many configurations in common with that of Embodiment 1. Therefore, differences from the power semiconductor device and the manufacturing method thereof according to Embodiment 1 will be described, and the same or corresponding components will be denoted by the same reference numerals and description thereof will be omitted. As illustrated in FIGS. 24 and 28 to 30, Embodiment 4 is different from Embodiment 1 in that terminals 3 opposite to each other through the package 1 have a different thickness.

As illustrated in FIG. 24, similar to Embodiment 1, in the adjacent terminals 3, the spatial insulation distance of the terminal bending portions 4 is equal to or greater than the spatial insulation distance of the contact portion of the terminals 3 on the package 1 side.

Figure 29:
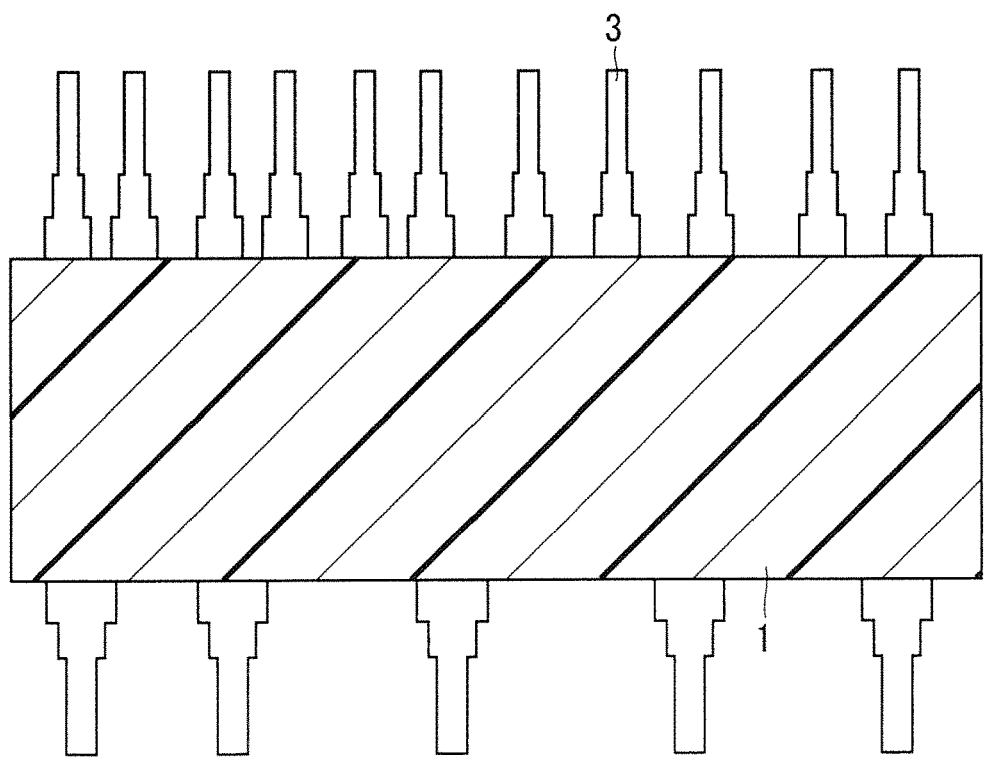
FIG. 29 is a plan view illustrating the package after lead cutting according to Embodiment 4.
Figure 30:
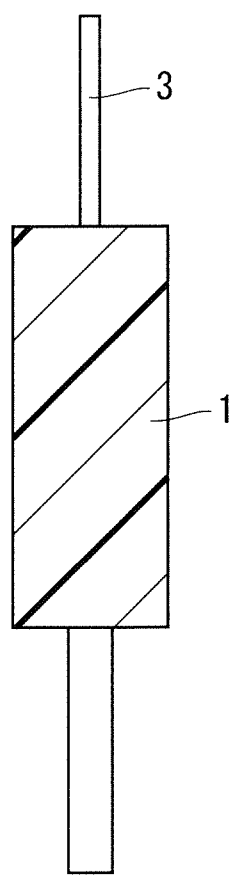
FIG. 30 is a side view illustrating the package after lead cutting according to Embodiment 4.

FIG. 26 illustrates a plan view of the power semiconductor device having a lead frame after sealing, and FIG. 27 illustrates a side view thereof. As illustrated in FIGS. 26 and 27, the thicknesses of the lead frame 2 is different toward its opposite ends. As in Embodiment 1, tie bar cutting is performed (FIG. 28), and plating and lead cutting are performed (FIGS. 29 and 30). Therefore, as illustrated in FIG. 25, the thickness of the terminal 3 is different. The thickness of one terminal 3 is 0.3 to 1.0 mm, and the thickness of the other terminal 3 opposite to it is about 1.5 times the thickness of the one terminal 3. Such configuration is capable of dealing with a power semiconductor device of high current output.

Further, corresponding to the specifications of the power semiconductor device, for example, for the terminal 3 connected from a semiconductor element such as a MOSFET or IGBT, the thickness of the terminal 3 increases as the value of the flowing current increases. On the other hand, for the terminal 3 connected from a semiconductor element such as an IC, the thickness of the terminal 3 may be small as the value of the flowing current is small. Thus, in accordance with the current value, the power semiconductor device can be reduced in weight.

Also in Embodiment 4, in the package 1 in which the semiconductor element is sealed, and having the lead frame 2, cutting, plating, lead cutting, and lead forming of the tie bars 5 are performed to have a width smaller than the width of the terminal 3 in contact with the package 1. The width of the terminal 3 that is bent and exposed from the side surface of the package is equal to or smaller than the width of the terminal 3 in contact with the package 1. With the above configuration, a spatial insulation distance between adjacent terminals 3 is secured, and insulation between adjacent terminals 3 is secured. Further, the width of the terminal 3 on the package 1 side is large and secures rigidity; therefore, mounting of the terminals 3 onto the control board can be facilitated without deforming or bending the terminal 3.

Also, in accordance with specification of power semiconductor devices, the spatial insulation distance is secured between the adjacent terminals 3 by adjusting the tie bar cut die 6 without changing the positions of the package 1 and the terminals 3. Also, mounting onto the same control board is ensured.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
a package in which a semiconductor element mounted on a lead frame is sealed;
a plurality of terminals exposed from side surfaces of the package and including a first plurality of terminals and a second plurality of terminals;
each of the first plurality of terminals includes:
a tip,
a first contact portion in contact with the package, and
a first terminal bending portion including a first bend, a width of the first bend being larger than a width of the tip and being equal to or smaller than a width of the first contact portion;
each of the second plurality of terminals includes:
a second contact portion in contact with the package, and
a second terminal bending portion including a second bend, a width of the second bend being larger than a width of the second contact portion, wherein
for each of the first plurality of terminals on one of the side surfaces of the package:
concaves are provided on each side of the first terminal bending portion, the concaves being entirely positioned between the first bend and the package, and an entirety of the concaves being located away from the package, and
a width of the first terminal bending portion at the concaves is larger than the width of the tip and is smaller than the width of the first contact portion.

2. A manufacturing method of the power semiconductor device according to claim 1, comprising:
cutting and removing, in the package having the lead frame that is sealed, tie bars of the lead frame by a tie bar cut die such that, for each of the first plurality of terminals, a width of the first terminal bending portion at a location to become the first bend and exposed from the package is smaller than the width of the first contact portion in contact with the package;
plating each of the first plurality of terminals by a plating device;
cutting and removing a lead of the lead frame by a lead cut die; and
bending each of the first plurality of terminals at the first terminal bending portion by a lead forming die to form the first bend.

3. The power semiconductor device according to claim 1, wherein
respective first contact portions of adjacent ones of the first plurality of terminals are spaced from each other by a first distance, and
respective second contact portions of adjacent ones of the second plurality of terminals are spaced from each other by a second distance larger than the first distance.

* * * * *